(12) United States Patent
Morris

(10) Patent No.: US 9,273,411 B2
(45) Date of Patent: Mar. 1, 2016

(54) GROWTH DETERMINATION IN THE SOLIDIFICATION OF A CRYSTALLINE MATERIAL

(71) Applicant: GTAT Corporation, Merrimack, NH (US)

(72) Inventor: Edward P. Morris, Malden, MA (US)

(73) Assignee: GTAT Corporation

( * ) Notice: Subject to any disclaimer, the term of this patent is extended or adjusted under 35 U.S.C. 154(b) by 653 days.

(21) Appl. No.: 13/667,640

(22) Filed: Nov. 2, 2012

(65) Prior Publication Data

US 2014/0123891 A1   May 8, 2014

(51) Int. Cl.
*C30B 11/00* (2006.01)
*C30B 29/06* (2006.01)
*C30B 29/20* (2006.01)

(52) U.S. Cl.
CPC ............... *C30B 11/006* (2013.01); *C30B 29/06* (2013.01); *C30B 29/20* (2013.01); *Y10T 117/1004* (2015.01); *Y10T 117/1008* (2015.01); *Y10T 117/1092* (2015.01)

(58) Field of Classification Search
CPC .... C30B 11/00; C30B 11/003; C30B 11/006; Y10T 117/00; Y10T 117/10; Y10T 117/1004; Y10T 117/1008; Y10T 117/1012; Y10T 117/1024; Y10T 117/1092
USPC .......... 117/11, 73–74, 81–83, 200–203, 206, 117/223, 904, 928, 931–932, 937, 950
See application file for complete search history.

(56) References Cited

U.S. PATENT DOCUMENTS

| | | | | |
|---|---|---|---|---|
| 6,077,345 A * | 6/2000 | Easoz | ..................... | C30B 15/02 117/14 |
| 7,172,656 B2 * | 2/2007 | Takanashi | ............... | C30B 15/26 117/14 |
| 7,344,596 B2 * | 3/2008 | Schmid | ................. | C30B 11/007 117/201 |
| 7,758,696 B2 * | 7/2010 | Stoddard et al. | ................. | 117/52 |
| 8,030,633 B2 * | 10/2011 | Stoddard | ............... | C30B 11/006 250/227.14 |
| 8,177,910 B2 * | 5/2012 | Schmid | ................. | C30B 11/007 117/20 |
| 2007/0044707 A1 * | 3/2007 | Schmid | ................. | C30B 11/007 117/11 |
| 2010/0165321 A1 * | 7/2010 | Hayashida | ............... | C30B 15/14 356/3.09 |
| 2011/0259262 A1 * | 10/2011 | Khattak | ................ | C30B 11/003 117/81 |
| 2012/0025112 A1 * | 2/2012 | Li | .......................... | G01F 23/292 250/577 |
| 2012/0282162 A1 * | 11/2012 | Skelton | ................. | C30B 11/006 423/348 |
| 2014/0338590 A1 * | 11/2014 | Duanmu | ............... | C30B 11/003 117/201 |

FOREIGN PATENT DOCUMENTS

WO      WO 2010069784 A1 *   6/2010

* cited by examiner

*Primary Examiner* — Kenneth A Bratland, Jr.
(74) *Attorney, Agent, or Firm* — Parker Ibrahim & Berg LLC

(57) ABSTRACT

A method for producing a crystalline material in a crucible in a crystal growth apparatus is disclosed. The method comprises, in part, the step of determining the amount of solidified material present in a partially solidified melt produced during the growth phase using at least one laser positioned at a height above the crucible. A crystal growth apparatus comprising the laser is also disclosed.

17 Claims, 1 Drawing Sheet

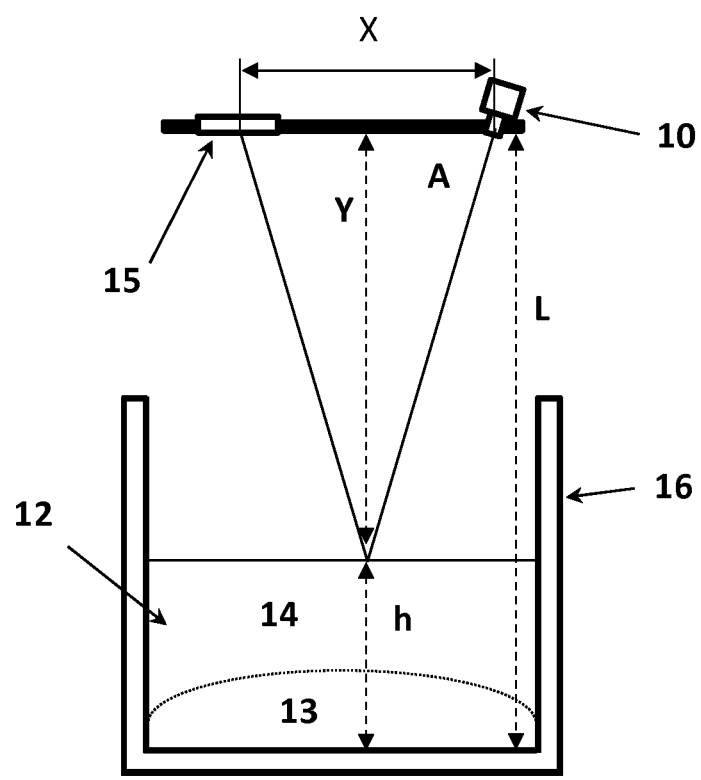

GROWTH DETERMINATION IN THE SOLIDIFICATION OF A CRYSTALLINE MATERIAL

BACKGROUND OF THE INVENTION

1. Field of the Invention

The present invention relates to a method and apparatus for determining the extent of growth during the preparation of a crystalline material, such as sapphire or silicon.

2. Description of the Related Art

Crystal growth apparatuses or furnaces, such as directional solidification systems (DSS) and heat exchanger method (HEM) furnaces, involve the melting and controlled resolidification of a feedstock material, such as alumina or silicon, in a crucible to produce an ingot. Production of a solidified ingot from molten feedstock occurs in several identifiable steps over many hours. For example, to produce an ingot, such as a sapphire ingot, by the HEM method, solid feedstock, such as alumina, is provided in a crucible containing a monocrystalline seed (which comprises the same material as the feedstock but with a single crystal orientation throughout) placed into the hot zone of a solidification furnace. A heat exchanger, such as a helium-cooled heat exchanger, is positioned in thermal communication with the crucible bottom and with the monocrystalline seed. The feedstock is then heated to form a liquid feedstock melt, without substantially melting the monocrystalline seed, and heat is then removed from the melted feedstock by applying a temperature gradient in the hot zone in order to directionally solidify the melt from the unmelted seed. By controlling how the melt solidifies, a crystalline material having a crystal orientation corresponding to that of the monocrystalline seed, and having greater purity than the starting feedstock material, can be achieved.

In such crystallization methods, it is important to monitor the extent of solidification in order to produce a high quality final product. Variations in the rate of growth can result in significant variations throughout the growing crystalline material, and such variability can reduce the amount of useful material in the final ingot. However, it is often a challenge to efficiently and accurately identify how much of the melted feedstock has solidified throughout the growth phase. Typically, the extent of crystal growth is determined manually by inserting a dip rod into the melt at various time intervals and measuring the penetration depth. However, the dip rod method has significant disadvantages. For example, dip rods can be easily broken in the partially solidified material or, at the very least, can introduce impurities into the final product. Also, this manual method is time and labor intensive, requiring the presence of skilled operators, thereby increasing the overall cost of ingot production. Finally, dip rod data cannot efficiently be used for process control. Thus, if a difference is found between the measured growth rate and the expected or targeted growth rate, changes to the process cannot be made instantaneously.

Thus, there is a need in the industry for methods and devices that can be used to efficiently and effectively monitor the directional solidification of a feedstock melt in a crystal growth apparatus, in order to ensure a consist growth process.

SUMMARY OF THE INVENTION

The present invention relates to a method of producing a crystalline material in which a crystal growth apparatus is provided that comprises a chamber and a hot zone within the chamber. The hot zone comprises at least one heating system, at least one heat removal system, and a crucible containing at least solid feedstock. The method further comprises the steps of heating the solid feedstock in the crucible with the heating system to form a liquid feedstock melt, removing heat from the hot zone with the heat removal system to form a partially solidified melt comprising solidified crystalline material submerged in remaining liquid feedstock, and determining an amount of solidified crystalline material in the partially solidified melt with at least one laser positioned at a height above the crucible. The partially solidified melt can then be further solidified to form the crystalline material. Various specific embodiments of the method are described herein.

The present invention further relates to a crystal growth apparatus for producing a crystalline material. In one embodiment, the crystal growth apparatus is a sapphire crystal growth apparatus comprising a chamber and a hot zone within the chamber comprising at least one heating system, at least one heat removal system, and a crucible containing at least solid alumina. The heat removal system comprises a heat exchanger positioned beneath the crucible. In another embodiment, the crystal growth apparatus is a silicon crystal growth apparatus comprising a chamber and a hot zone within the chamber comprising at least one heating system, at least one heat removal system, and a crucible containing at least solid silicon. The heat removal system comprises insulation positioned around the hot zone having at least one section vertically movable within the chamber. For both of these embodiments, the apparatus further comprises at least one laser positioned at a height above the crucible.

It is to be understood that both the foregoing general description and the following detailed description are exemplary and explanatory only and are intended to provide further explanation of the present invention, as claimed.

BRIEF DESCRIPTION OF THE DRAWINGS

FIG. 1 is a schematic view of an embodiment of the method and crystal growth apparatus of the present invention.

DETAILED DESCRIPTION OF THE INVENTION

The present invention relates to a method of producing a crystalline material using a laser to determine the extent of growth in a crystal growth apparatus, as well as to a crystal growth apparatus for producing the crystalline material.

The method of the present invention is a method of producing a crystalline material, including, for example, a silicon ingot or a sapphire boule. The method comprises the step of providing a crystal growth apparatus having various components, heating solid feedstock contained within a crucible in the crystal growth apparatus to form a melt, and removing heat to solidify the melt. Solidification is monitored using at least one laser, described in more detail below, positioned at a height above the crucible.

The crystal growth apparatus used in the method of the present invention is a furnace, in particular a high-temperature furnace, capable of heating and melting a solid feedstock, such as alumina or silicon, at temperatures generally greater than about 1000° C. and subsequently promoting resolidification of the resulting melted feedstock material to form a crystalline material. For example, the crystal growth apparatus can be a directional solidification system (DSS) crystal growth furnace or a heat exchanger method (HEM) crystal growth furnace, but is preferably a HEM furnace.

The crystal growth apparatus comprises an outer furnace chamber or shell and an interior hot zone within the chamber. The chamber can be any known in the art used for high temperature crystallization furnaces, including a stainless steel shell comprising an outer wall and an inner wall defining a cooling channel for circulation of a cooling fluid, such as water. The hot zone of the crystal growth apparatus is an interior region within the furnace in which heat can be provided and controlled to melt and resolidify a feedstock material, described in more detail below. The hot zone is surrounded by and defined by insulation, which can be any material known in the art that possesses low thermal conductivity and is capable of withstanding the temperatures and conditions in a high temperature crystal growth furnace. For example, the hot zone can be surrounded by insulation of graphite. The shape and dimension of the hot zone can be formed by a plurality of insulation panels, some of which can be either stationary or mobile. For example, the hot zone may be formed of top, side, and bottom insulation panels, with either the top and side insulation panels or the bottom panel configured to move vertically relative to a crucible placed within the hot zone.

The hot zone comprises a crucible capable of containing at least feedstock material, described in more detail below. The crucible used in the method of the present invention can be any container known in the art for holding, melting, and resolidifying a feedstock material and can be made of various heat resistant materials, for example, quartz, silica, graphite, or molybdenum, depending on a variety of factors, including the type of feedstock used. For example, for a silicon-containing feedstock, a quartz crucible is preferred while a molybdenum crucible may be preferably for growing sapphire. In addition, the crucible can have a variety of different shapes having at least one side and a bottom, including, for example, cylindrical or cubic/cuboid (having a square cross-section) and may further be tapered. Optionally, the crucible is coated to prevent cracking of the ingot after solidification. If desired, the crucible optionally may also be contained within a crucible box, comprising at least one side plate and a bottom plate and optionally further comprising a lid, in order to provide added stability and rigidity to the crucible.

The crucible within the hot zone contains a charge used to form a crystalline product, such as sapphire or a silicon ingot. The charge in the crucible comprises feedstock material, such as alumina or polycrystalline or multicrystalline silicon, which can be in any form known in the art, including powder, pellets, or larger chunks or pieces. When the crystalline product formed from the method of the present invention comprises a region of monocrystalline material, which is a region having one consistent crystal orientation throughout (such as sapphire or monocrystalline silicon), the charge further comprises at least one monocrystalline seed, which comprises the same material as the feedstock except having a single crystal orientation. For example, the crucible can comprise alumina feedstock placed upon at least one monocrystalline sapphire seed. Any type of seed crystal known in the art can be used. For example, the monocrystalline seeds may be circular or polygonal, such as square or rectangular, in cross-sectional shape. Also, each of the seeds preferably has a flat lower surface to provide good contact with the interior surface of the bottom of the crucible, and, more preferably, further has a flat upper surface as well. The number of monocrystalline seeds can vary depending, for example, on the inner dimensions of the crucible used, the size of the seeds, and the type of crystal growth apparatus used. For example, for a HEM furnace, one seed is typically used while for a DSS furnace, a plurality of seeds may be used.

The hot zone within the chamber of the crystal growth apparatus further comprises at least one heating system, such as multiple heating elements, to provide heat to the crucible to melt the solid feedstock contained therein. For example, the hot zone can comprise a top heating element, positioned in the upper region of the hot zone above the crucible, and at least one side heating element positioned below the top heating element and along the sides of the hot zone and the crucible. The side heating elements preferably surround the outer periphery of the crucible and can be any shape or size known in the art. For example, the side heating elements can have a size and overall shape similar to the vertical cross sectional shape of the crucible, and the top heating element can have a size and overall shape similar to the horizontal cross sectional shape of the crucible. The top heating element can also be circular in shape. If multiple heating elements are used, the temperature in the hot zone may be controlled by independently regulating the power provided to each of the various heating elements using either a single controller or multiple controllers.

The crystal growth apparatus used in the method of the present invention further comprises at least one means for removing heat from the hot zone. Any means known in the art can be used to remove heat to form the crystalline material. For example, directional solidification of the melt can be achieved through controlled heat extraction from the crucible by gradually increasing radiant heat losses to the water-cooled chamber, such as through the bottom of the hot zone. When the apparatus is a DSS furnace, the means for removing the heat can comprise movable sections of the insulation that surrounds the hot zone and the crucible provided therein. For example, the top and side insulation panels of the hot zone can be configured to move vertically while the bottom insulation panel is configured to remain stationary. Alternatively, as another example, the top and side insulation panels may be configured to remain stationary while the bottom insulation panel is configured to move vertically. Other combinations are also possible. In this way, heat may be removed without moving the crucible. When the apparatus is a HEM furnace, the means for removing heat from the hot zone can be a heat exchanger, such as a helium-cooled heat exchanger, provided to be in thermal communication with the bottom of the crucible placed within the hot zone.

The method of the present invention comprises the steps of heating the solid feedstock contained within the crucible with the heating system, thereby forming a liquid feedstock melt and, subsequently, removing heat from the liquid feedstock melt to form the crystalline material, which can then be annealed, if desired, prior to final cooling and removal from the crystal growth apparatus. If the crucible contains at least one monocrystalline seed, preferably, the heating melts the feedstock without substantially melting the seed.

Prior to complete solidification, a mixture is formed comprising both unmelted and melted material. For a directional solidification apparatus, such as a DSS or HEM furnace, the partially solidified melt comprises solidified material that is fully submerged in remaining liquid feedstock, especially in the early stages of solidification. Towards the end, solidified material appears above the melt, signally that solidification is nearly complete. As mentioned above, it is important to monitor the extent of solidification in order to produce a high quality final product, since variability in the rate of growth can produce inconsistencies and variability in the growing crystalline material. However, current methods, which typically involving the insertion of a measuring device, such as a dip rod, into the melt, can introduce impurities into the growing crystal and are both labor intensive and difficult to perform consistently and repeatably, both within a run as well as between separate runs. Furthermore such methods do not readily lend themselves to process control or automation.

To overcome these problems, the method of the present invention further comprises the step of determining the amount of solidified material submerged in the remaining liquid feedstock using at least one laser that is positioned at a height above the crucible. Multiple lasers may also be used for improved accuracy. Preferably, the laser is positioned outside of the chamber of the crystal growth apparatus, with the laser output being directed through a port in the chamber wall above the crucible. A variety of different lasers can be used, depending on, for example, the type of material being solidified, the reflectivity of the material surface, and cost. Preferably, the laser is a triangulation laser equipped with a sensor or array of sensors positioned to detect the laser output reflected off of or projected onto the melt surface. The laser output and detection can occur through the same or different ports in the chamber wall. For example, the laser can be used to project an image, such as a dot, on the surface of the partially solidified melt that can be viewed by a nearby diffuse light detector or array of sensors. Such a laser is particularly useful for melt surfaces that are not highly reflective, such as the surface of an alumina melt. Alternatively, for mirror-like melt surfaces which do not produce much scattering of light, such as a silicon melt surface, a laser that incorporates a specular light sensor may be preferable. Specific examples of lasers and diffuse or specular light sensors will be known to one of ordinary skill in the art.

The laser can be used to determine the amount of solidified material present in the partially solidified melt and thus, the extent of solidification during growth of the final crystalline material, in a variety of different ways. In particular, the laser can be used to measure the height of the melt surface. This is shown schematically in FIG. 1. Thus, for example, the output of triangulation laser 10 would reflect off of the surface of partially solidified melt 12 and be detected by the laser sensor 15. Knowing the position of the laser above crucible 16 (such as angle A and height above the crucible bottom L) and measuring the distance X between the laser output and its point of detection, the distance Y to the top of the liquid melt can be calculated and, thus, the height h of the partially solidified melt in the crucible can be determined. Typically, lasers are capable of making multiple measurements very rapidly, providing a more precise measurement of the melt height compared to previously known methods.

Once the height of the partially solidified melt is known, the extent of solidification can be determined using a variety of different techniques, particularly those which rely on the differences in properties between the material in its liquid state and in its solid state. For example, it is known that a change in density can occur as certain materials go from a liquid melt to a solid. Some materials, such as alumina, have a higher density in their solid state while others, such as silicon, decrease in density upon solidification. Partially melted mixtures comprising both solid and liquid materials typically have a weighted average density.

Thus, in one embodiment of the method of the present invention, the method further comprises the step of calculating a density of the partially solidified melt from the measured surface height. All that is required is knowledge of the geometry of the crucible and the total amount of material provided (and therefore the melt height when fully melted), along with an understanding of the relationship between the solid and liquid densities. The initial melt height can also be directly measured, such as with the laser. By comparing the density of the partially solidified melt to the density of the material as a liquid and/or as a solid, the amount of solidified crystalline material present in the partially solidified melt can be determined. Furthermore, multiple measurements can be taken over a desired time period, and from this, a rate of solidification can be determined.

As a specific example of the method of the present invention, a crucible of known dimensions containing 100 kg of aluminum oxide feedstock (alumina) on top of a sapphire seed was heated in the hot zone of a HEM furnace to fully melt the feedstock without substantially melting the seed. Directional solidification was initiated using a prescribed solidification profile by removing heat from the melt using the heat exchanger positioned beneath the crucible. A triangulation laser (using blue light of 405 nm wavelength) equipped with a specular light detector, positioned outside the furnace focused through a single viewport above the crucible, was used to measure the distance to the surface of the partially solidified melt that was formed. Data was collected at 500 hz, averaged over 60 seconds, and recorded. It was found that the distance to the melt height, and therefore the height of the melt, could readily and efficiently be determined every minute throughout the solidification process. Knowing the relative densities of sapphire in both the liquid state (3.03 gr/cc) and solid state (3.78 gr/cc), as well as knowing the crucible geometry and size, the percent solidification was also readily calculated throughout the entire growth phase.

Thus, it was found that a laser positioned above the crucible can effectively be used to determine the amount of solidified material submerged within a partially solidified melt as a crystalline material, such as a sapphire boule, is grown, without disturbing or even detecting the presence of the solid itself. This is particularly surprising considering that the changes in the measured height between a fully melted and fully solidified material are relatively small, especially at the scales (kilograms of feedstock) that are typically used. For example, during sapphire growth, an overall decrease in the height of the melt of approximately 20% would be expected since sapphire has a higher density than liquid alumina, and this would result in an overall increase in the distance to the melt surface during solidification. By comparison, for solidifying silicon, an overall increase in the melt height of approximately 10% would be expected due to differences in densities—i.e., the melt height would be expected to increase during growth and, thus, the distance between the melt surface and the laser would be expected to decrease. Since the time frame for crystal growth is typically long (on the order of days), extremely small changes in melt height would be expected during incrementally small periods of time. However, the laser method of the present invention is very capable of detecting these very small changes in melt height over small periods of time. Using this method, changes as small as 0.5 mm have been detected.

Thus, the method of the present invention can be used to monitor the extent of growth of a crystalline material over relatively short periods of time. As a result, changes to process conditions can therefore also be made in very short periods of time, thereby ensuring consistent growth throughout the full growth cycle. For example, once the extent of solidification or the rate has been calculated as the crystalline material grows, the results can then be compared to the extent of solidification that would be expected for the desired or targeted solidification rate. If more than the expected amount of solid material is found, the rate of solidification can then be slowed, such as by removing less heat from the hot zone. Alternatively, if the extent of solidification is less than expected, the rate can be increased, such as by increasing heat removal or by decreasing the temperature in the hot zone. This can be done manually by an operator but is preferably automated. For example, the crystal growth apparatus used in the method of the present invention may comprise at least one control system connected to the heating system, the heat removal system, or both. The control system can be configured to control the step of removing heat from the hot zone by comparing the determined rate of solidification to a target rate of solidification. Crystal growth can then be continued until the material in the crucible is fully solidified, thereby forming the desired final crystalline material. By producing a crystalline product under consistent growth conditions, improved overall crystal properties would be expected.

The present invention further relates to a crystal growth apparatus comprising at least one laser for determining the amount of solidified material present in a partially solidified melt. Preferably, the apparatus can be used in the method of the present invention. The crystal growth apparatus can be any of those described above, such as a DSS furnace or a HEM furnace. The crystal growth apparatus comprises a chamber and a hot zone inside the chamber. The hot zone comprises a crucible containing at least solid feedstock such as silicon or alumina, at least one heating system such as one or more heating elements, and at least one heat removal system such as movable insulation surrounding the hot zone or a heat exchanger placed beneath the crucible. The laser is positioned at a height above the crucible, preferably being attached outside the chamber and can be any of the lasers discussed above. The apparatus may further comprise at least one control system connected to the heating system, the heat removal system, or both. In one embodiment, the apparatus is a sapphire crystal growth apparatus, wherein the heat removal system comprises a heat exchanger, such as a helium cooled heat exchanger, positioned beneath the crucible and the laser is equipped with either a diffuse light sensor or a specular light sensor to detect the laser output. In another embodiment, the apparatus is a silicon crystal growth apparatus, wherein the heat removal system comprises insulation positioned around the hot zone having at least one section vertically movable within the chamber and the laser is equipped with a specular light sensor for detecting the laser output. For both embodiments, after the material contained within the crucible is melted and a partially solidified melt comprising solidified crystalline material submerged, particularly fully submerged, in remaining liquid feedstock is formed, the laser is positioned to determine the amount of solidified material in the partially solidified melt contained within the crucible.

The foregoing description of preferred embodiments of the present invention has been presented for the purposes of illustration and description. It is not intended to be exhaustive or to limit the invention to the precise form disclosed. Modifications and variations are possible in light of the above teachings, or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

The invention claimed is:

1. A method of producing a crystalline material comprising the steps of:
   i) providing a crystal growth apparatus comprising a chamber and a hot zone within the chamber, the hot zone comprising at least one heating system, at least one heat removal system, and a crucible containing at least solid feedstock;
   ii) heating the solid feedstock in the crucible with the heating system to form a liquid feedstock melt;
   iii) removing heat from the hot zone with the heat removal system to form a partially solidified melt comprising solidified crystalline material submerged in remaining liquid feedstock;
   iv) determining an amount of solidified crystalline material in the partially solidified melt with at least one laser positioned at a height above the crucible by measuring a surface height of the remaining liquid feedstock with the laser, calculating a density of the partially solidified melt from the measured surface height, and comparing the density of the partially solidified melt to a density of the liquid feedstock, a density of the solidified crystalline material, or both; and
   v) further solidifying the partially solidified melt to form the crystalline material.

2. The method of claim 1, wherein the crystal growth apparatus is a directional solidification furnace.

3. The method of claim 1, wherein the heat removal system comprises a helium-cooled heat exchanger positioned beneath the crucible.

4. The method of claim 1, wherein the heat removal system comprises insulation positioned around the hot zone having at least one section vertically movable within the chamber.

5. The method of claim 1, wherein the method further comprises the step of determining a rate of solidification by determining the amount of solidified crystalline material in the partially solidified melt with the laser over a desired time period.

6. The method of claim 5, wherein the crystal growth apparatus further comprises at least one control system connected to the heating system, the heat removal system, or both, the control system being configured to control the step of removing heat from the hot zone by comparing the determined rate of solidification to a target rate of solidification.

7. The method of claim 1, wherein the laser has an output detected by at least one sensor.

8. The method of claim 7, wherein the output is detected by at least one specular light sensor.

9. The method of claim 7, wherein the output is detected by at least one diffuse light sensor.

10. The method of claim 1, wherein the laser is positioned outside the chamber.

11. The method of claim 10, wherein the laser has on output directed through a port in the chamber positioned above the crucible, the output being reflected off of the remaining liquid feedstock back through the port to a detector.

12. The method of claim 10, wherein the laser has an output directed through a first port in the chamber positioned above the crucible, the output being reflected off of the remaining liquid feedstock melt back through a second port in the chamber positioned above the crucible to a detector.

13. The method of claim 1, wherein the solid feedstock comprises alumina.

14. The method of claim 13, wherein the crystalline material is sapphire.

15. The method of claim 1, wherein the solid feedstock comprises silicon, and wherein the laser has an output detected by a specular light sensor.

16. The method of claim 15, wherein the crystalline material is silicon.

17. The method of claim 15, wherein the crystalline material is monocrystalline silicon.

* * * * *